(12) United States Patent  (10) Patent No.: US 12,147,131 B2
Tang et al.  (45) Date of Patent: Nov. 19, 2024

(54) DISPLAY DEVICE, DISPLAY PANEL, AND ARRAY SUBSTRATE

(71) Applicants: MIANYANG HKC OPTOELECTRONICS TECHNOLOGY CO., LTD., Mianyang (CN); HKC CORPORATION LIMITED, Shenzhen (CN)

(72) Inventors: Rong Tang, Shenzhen (CN); Haoxuan Zheng, Shenzhen (CN)

(73) Assignees: MIANYANG HKC OPTOELECTRONICS TECHNOLOGY CO., LTD., Mianyang (CN); HKC CORPORATION LIMITED, Shenzhen (CN)

( * ) Notice: Subject to any disclaimer, the term of this patent is extended or adjusted under 35 U.S.C. 154(b) by 118 days.

(21) Appl. No.: 18/086,563

(22) Filed: Dec. 21, 2022

(65) Prior Publication Data

US 2023/0314884 A1 Oct. 5, 2023

(30) Foreign Application Priority Data

Mar. 30, 2022 (CN) .......................... 202210333972.7

(51) Int. Cl.
*G02F 1/135* (2006.01)
*G02F 1/00* (2006.01)
(Continued)

(52) U.S. Cl.
CPC .......... *G02F 1/1351* (2021.01); *G02F 1/0063* (2013.01); *H01L 27/1214* (2013.01);
(Continued)

(58) Field of Classification Search
None
See application file for complete search history.

(56) References Cited

U.S. PATENT DOCUMENTS

| 2021/0020755 A1* | 1/2021 | Yan | H01L 29/78618 |
| 2022/0223629 A1* | 7/2022 | Song | H01L 29/41733 |
| 2022/0223754 A1* | 7/2022 | Ahn | H01L 33/38 |

FOREIGN PATENT DOCUMENTS

| CN | 103018989 A | 4/2013 |
| CN | 202990229 U | 6/2013 |

(Continued)

OTHER PUBLICATIONS

Chinese First Office Action, Chinese Application No. 202210333972.7, mailed Feb. 11, 2023 (13 pages).
(Continued)

*Primary Examiner* — Ashok Patel

(57) ABSTRACT

A display device, a display panel, and an array substrate are provided. The array substrate includes an active layer and a light-blocking and heat-insulating layer. The light-blocking and heat-insulating layer is arranged on a side of the active layer and configured to block light and insulate heat for the active layer. The light-blocking and heat-insulating layer includes light-absorbing materials and light-reflecting materials. One of the light-absorbing materials and the light-reflecting materials form a light-blocking body. The other one of the light-absorbing materials and the light-reflecting materials are dispersed in the light-blocking body.

13 Claims, 3 Drawing Sheets

(51) Int. Cl.
    *G02F 1/13357*    (2006.01)
    *H01L 27/12*      (2006.01)
(52) U.S. Cl.
    CPC ........ *G02F 1/1336* (2013.01); *G02F 2201/08* (2013.01); *G02F 2201/34* (2013.01)

(56) References Cited

FOREIGN PATENT DOCUMENTS

| CN | 103579356 A   | 2/2014  |
|----|---------------|---------|
| CN | 204509177 U   | 7/2015  |
| CN | 107093611 A   | 8/2017  |
| CN | 208240671 U   | 12/2018 |
| CN | 109146945 A   | 1/2019  |
| CN | 110224000 A   | 9/2019  |
| CN | 110928092 A   | 3/2020  |
| CN | 111584752 A   | 8/2020  |
| CN | 111610343 A   | 9/2020  |
| CN | 111613626 A   | 9/2020  |
| CN | 111679496 A   | 9/2020  |
| CN | 113097228 A   | 7/2021  |
| KR | 20170135657 A | 12/2017 |
| WO | 2020024292 A1 | 2/2020  |

OTHER PUBLICATIONS

Chinese second Office Action, Chinese Application No. 202210333972.7, mailed Mar. 17, 2023 (13 pages).
Chinese Rejection decision, Application No. 202210333972.7, mailed Jun. 1, 2023 (12 pages).

* cited by examiner

DISPLAY DEVICE, DISPLAY PANEL, AND ARRAY SUBSTRATE

CROSS REFERENCE TO RELATED APPLICATIONS

The present application claims the priority of Chinese Patent Application No. 202210333972.7, filed on Mar. 30, 2022, which is entirely incorporated into the present application by reference.

TECHNICAL FIELD

The present disclosure relates to the technical field of display devices, and in particular to a display device, a display panel, and an array substrate.

BACKGROUND

Most of the liquid crystal display devices in the related market are backlight liquid crystal displays. The backlight liquid crystal display includes a liquid crystal display panel and a backlight module. A working principle of the liquid crystal display panel is to inject liquid crystal molecules between an array substrate and a color film substrate, and apply a voltage on the two substrates to control a rotating direction of each of the liquid crystal molecules, so as to refract light of the backlight module to produce an image.

Since the array substrate of the liquid crystal display panel is very sensitive to light and temperature, in response to being illuminated by the light, a thin film transistor (TFT) of the array substrate will be affected by double effects of photogenerated carriers and a temperature rise, so that a stability of the array substrate is seriously affected, and a product quality of the display panel is affected.

SUMMARY

To solve the aforesaid problems, the first technical solution adopted by some embodiments of the present disclosure is as follows: an array substrate is provided. The array substrate includes an active layer and a light-blocking and heat-insulating layer. The light-blocking and heat-insulating layer is arranged on a side of the active layer and configured to block light and insulate heat for the active layer. The light-blocking and heat-insulating layer includes light-absorbing materials and light-reflecting materials. One of the light-absorbing materials and the light-reflecting materials form a light-blocking body. The other one of the light-absorbing materials and the light-reflecting materials are dispersed in the light-blocking body.

To solve the aforesaid problems, the second technical solution adopted by some embodiments of the present disclosure is as follows: a display panel is provided. The display panel includes a first substrate, a second substrate, and a display medium. The second substrate is correspondingly arranged with the first substrate. The display medium is located between the first substrate and the second substrate. The second substrate includes a substrate baseplate, a plurality of thin film transistors arranged in an array on a side of the substrate baseplate, and a plurality of light-blocking and heat-insulating layers corresponding to the plurality of thin film transistors in one-to-one correspondence. Each of the plurality of thin film transistors includes an active layer. Each of the plurality of light-blocking and heat-insulating layers is arranged between the active layer of a corresponding one of the plurality of thin film transistors and the substrate baseplate, or arranged on a side of the substrate baseplate away from the active layer of the corresponding one of the plurality of thin film transistors. The light-blocking and heat-insulating layer includes light-absorbing materials and light-reflecting materials, one of the light-absorbing materials and the light-reflecting materials form a light-blocking body, and the other one of the light-absorbing materials and the light-reflecting materials are dispersed in the light-blocking body.

To solve the aforesaid problems, the third technical solution adopted by some embodiments of the present disclosure is as follows: a display device is provided. The display device includes a backlight module and the display panel described above.

BRIEF DESCRIPTION OF THE DRAWINGS

In order to illustrate the technical solutions in some embodiments of the present disclosure more clearly, the following will briefly introduce the figures needed to be used in the description of some embodiments. Obviously, the figures in the following description are only some embodiments of the present disclosure, and those skilled in the art may derive other figures from these figures without paying any creative work.

Figure 1:
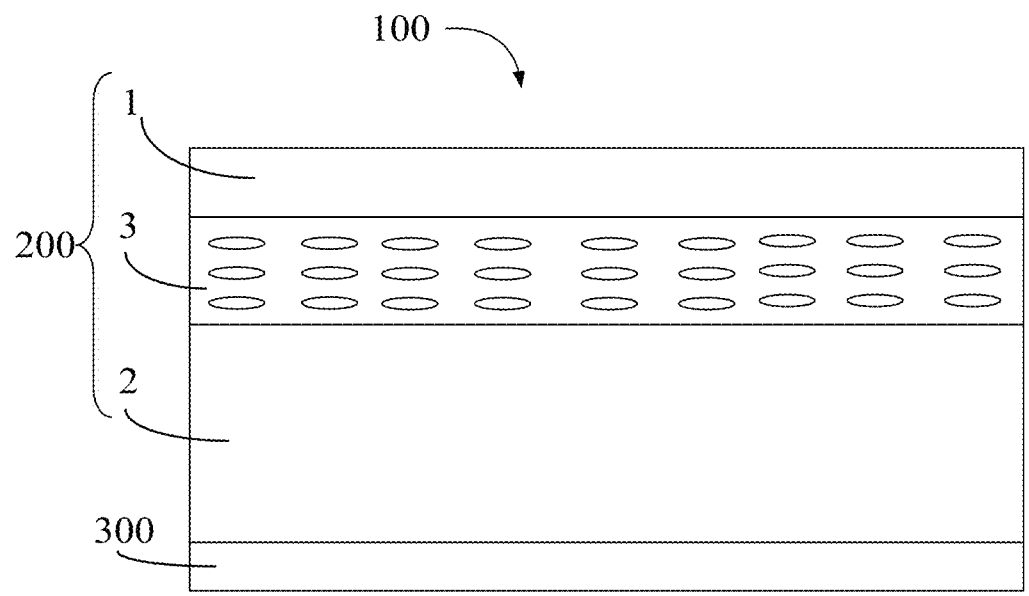
FIG. 1 is a schematic structural view of a display device provided by some embodiments of the present disclosure.

The figures show the following members: display device 100; display panel 200; color film substrate 1; array substrate 2; light-blocking and heat-insulating layer 20; light-blocking body 201; micropore 2011; microparticle 202; light-reflecting coating 203; substrate baseplate 21; thin film transistor 22; gate metal layer 2201; common electrode line 2202; gate insulating layer 2203; active layer 2204; source electrode 2205; drain electrode 2206; passivation layer 2207; color-resisting layer 2208; flattening layer 2209; anode 2210; cathode 2211; anode connecting portion 2212; cathode connecting portion 2213; liquid crystal layer 3; backlight module 300.

DETAILED DESCRIPTIONS

Schemes of embodiments of the present disclosure are described in detail below in combination with figures of the specification.

In following descriptions, specific details such as specific system structures, interfaces, technologies and the like are proposed for illustration rather than limitation, so as to fully understand the present disclosure.

Technical solutions in the embodiments of the present disclosure will be described clearly and completely with reference to the figures in the embodiments of the present disclosure. Obviously, the described embodiments are only a part of the embodiments of the present disclosure, rather than all the embodiments. Based on the embodiments of the present disclosure, all other embodiments obtained by those skilled in the art without any creative work are within the scope of the present disclosure.

Terms "first", "second", and "third" in the embodiments of the present disclosure are only used for descriptive purposes, and cannot be understood as indicating or implying relative importance or implicitly indicating the number of indicated technical features. Therefore, features defined with "first", "second", and "third" may explicitly or implicitly include at least one of the features. In the description of the present disclosure, "a plurality of" means at least two, such as two, three, etc., unless specifically defined otherwise. In the embodiments of the present disclosure, all directional indications (such as up, down, left, right, front, back, etc.) are only used to explain the relative position relationship, motion, etc. between components in a specific attitude (as shown in the figure). If the specific attitude changes, the directional indication will change accordingly. In addition, terms "including", "having", and any variations thereof are intended to cover non-exclusive inclusions. For example, a process, method, system, product, or device that includes a series of steps or units is not limited to the listed steps or units, but optionally includes unlisted steps or units, or optionally also includes other steps or units inherent to these processes, methods, products or equipment.

Mentioning "embodiments" herein means that a specific feature, structure, or characteristic described in conjunction with the embodiments may be included in at least one embodiment of the present disclosure. The appearances of the phrase in various places in the specification are not necessarily all referring to the same embodiment, nor are separate or alternative embodiments mutually exclusive of other embodiments. It is explicitly and implicitly understood by those skilled in the art that the embodiments described herein may be combined with other embodiments.

Materials of an active layer of an array substrate in a display panel, such as the active layer of a thin film transistor, are generally amorphous silicon semiconductor materials, and the amorphous silicon semiconductor materials are very sensitive to light and temperature. Since the array substrate inevitably needs backlight from a backlight module, the amorphous silicon semiconductor materials generate electron-hole pairs in response to being illuminated by the light, thereby generating photogenerated carriers, so that a stability of the array substrate is seriously affected. In addition, the amorphous silicon semiconductor materials also have a problem of temperature rise in response to being illuminated by the light. Therefore, an influence of the backlight emitted by the backlight module on the array substrate will cause poor display effects such as crosstalk and residual image of the display panel, and a product quality of the display panel is affected.

In order to solve problems of crosstalk and residual image of the display panel, some embodiments of the present disclosure provide an array substrate. The crosstalk, residual image, and other poor display effects affect the product quality of the display panel. The array substrate provided by some embodiments of the present disclosure blocks the backlight through a light-blocking and heat-insulating layer, so as to reduce crosstalk, residual image, and other poor display effects of the display panel. The light-blocking and heat-insulating layer provided by some embodiments of the present disclosure may also be used for other electronic products that need to block light and insulate heat for the active layer, such as a drive substrate of other types of display panels.

As shown in FIG. 1, FIG. 1 is a schematic structural view of a display device provided by some embodiments of the present disclosure.

Some embodiments provide a display device 100. The display device 100 includes a backlight module 300 and a display panel 200. The backlight module 300 may be configured to provide a light source for the display panel 200.

The backlight module 300 may be either direct-light-type or edge-light-type. The backlight module 300 may include optical elements such as a light source and a light guiding plate.

The display panel 200 includes a first substrate, a second substrate, and a display medium. The first substrate and the second substrate are opposite to each other. The display medium is located between the first substrate and the second substrate.

In some embodiments, the first substrate is a color film substrate 1, the second substrate is an array substrate 2, and the display medium is a liquid crystal layer 3. The color film substrate 1 and the array substrate 2 are opposite to each other, and the liquid crystal layer 3 is arranged between the color film substrate 1 and the array substrate 2. A support structure and a packaging rubber frame are also arranged between the color film substrate 1 and the array substrate 2. The display panel 200 is applicable to In-Plane Switching (IPS) displays and Fringe Field Switching (FFS) displays. The color film substrate 1 may include a glass substrate, a polarizer, a common electrode, a color filter layer, a black matrix layer, etc.

Figure 2:
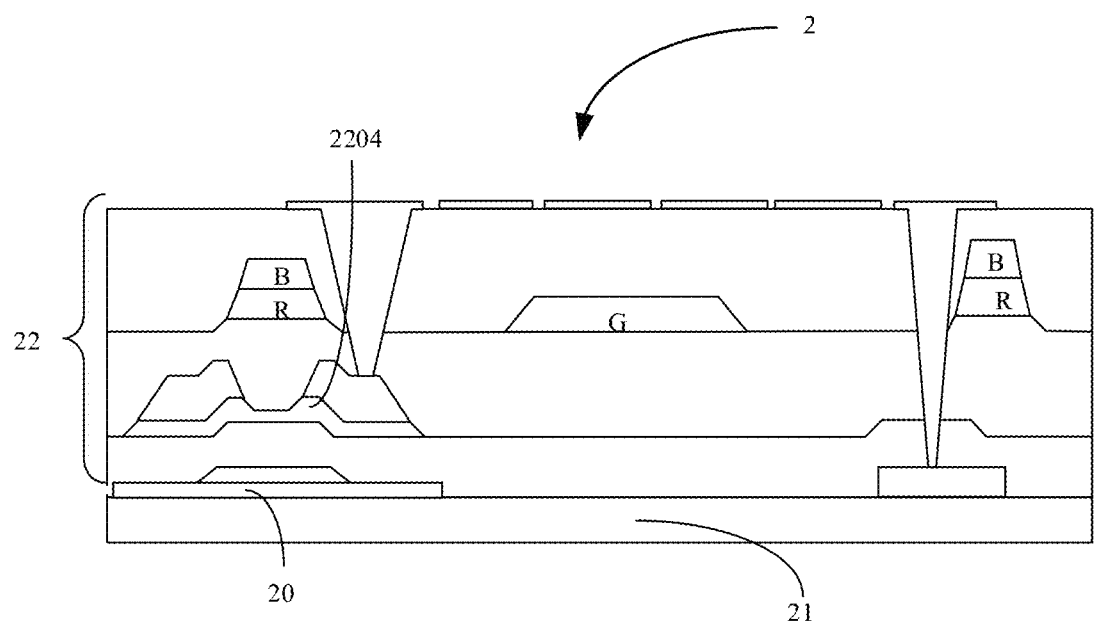
FIG. 2 is a schematic structural view of an array substrate provided by some embodiments of the present disclosure.

As shown in FIG. 2, FIG. 2 is a schematic structural view of an array substrate provided by some embodiments of the present disclosure.

The array substrate 2 includes an active layer 2204 and a light-blocking and heat-insulating layer 20. The light-blocking and heat-insulating layer 20 is arranged on a side of the active layer 2204, and configured to block light and insulate heat for the active layer 2204, so as to reduce a possibility that the backlight emitted by the backlight module 300 illuminates the active layer 2204. In some embodiments, the active layer 2204 is an amorphous silicon semiconductor layer.

In some embodiments, the array substrate 2 also includes a substrate baseplate 21 and one or more thin film transistors 22. The one or more thin film transistors 22 may include one thin film transistor or a plurality of thin film transistors arranged in an array. The one or more thin film transistors 22 are arranged on a side of the substrate baseplate 21. Each of the one or more thin film transistors 22 includes an active layer 2204. The light-blocking and heat-insulating layer 20 is arranged between the substrate baseplate 21 and the active layer 2204. A projection of the active layer 2204 projected on the substrate baseplate 21 is within a projection of the light-blocking and heat-insulating layer 20 projected on the substrate baseplate 21, so that the light-blocking and heat-insulating layer 20 completely covers the active layer 2204, thereby reducing an influence of external light on the active layer 2204. The light-blocking and heat-insulating layer 20 is also configured to reduce a possibility that heat is transmitted to the active layer 2204, thereby reducing a possibility that a process of laser crystallization of the active layer 2204 is affected. The backlight module 300 is arranged on a side of the substrate baseplate 21 away from the one or more thin film transistors 22 to provide a light source for the display panel 200. The light-blocking and heat-insulating layer 20 may also be arranged on a side of the substrate baseplate 21 away from the active layer 2204, as long as the light-blocking and heat-insulating layer 20 is located between the active layer 2204 and the backlight module 300, so as to block light and insulate heat for the active layer 2204.

A thickness of the light-blocking and heat-insulating layer 20 is in a range from approximately 0.5 μm to approximately 3 μm. In some embodiments, the thickness of the light-blocking and heat-insulating layer 20 is approximately 1.5 μm.

Figure 3:
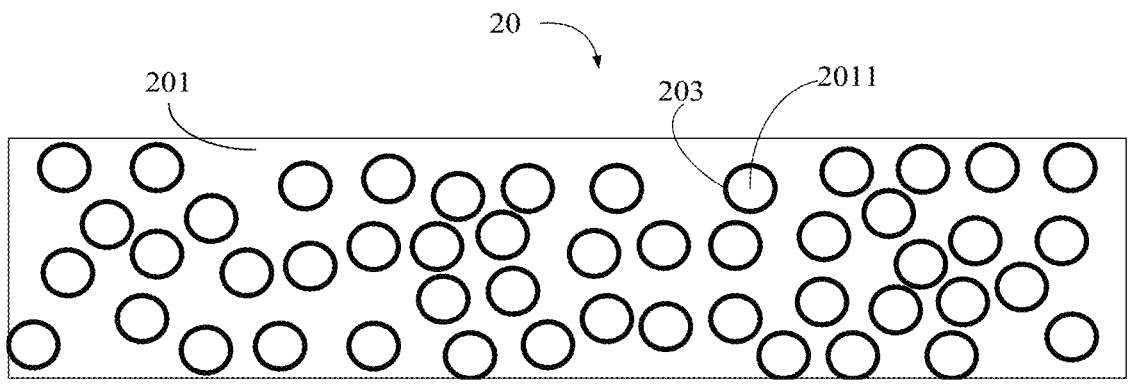
FIG. 3 is a schematic structural view of a light-blocking and heat-insulating layer provided by some embodiments of the present disclosure.

As shown in FIG. 3, FIG. 3 is a schematic structural view of an embodiment of the light-blocking and heat-insulating layer provided by some embodiments of the present disclosure.

The light-blocking and heat-insulating layer 20 includes light-absorbing materials and light-reflecting materials. In some embodiments, a light-blocking body 201 may include the light-absorbing materials. In some embodiments, a light-blocking body 201 is formed by or made of the light-absorbing materials. The light-blocking body 201 absorbs the light emitted by the backlight module 300 and reduces a possibility that the light emitted by the backlight module 300 contacts the active layer 2204. The light-reflecting materials are dispersed in the light-blocking body 201 to reflect the backlight emitted by the backlight module 300 to other areas in which the active layer 2204 is not arranged, so that a brightness contrast of the display panel 200 is improved, and a possibility that the active layer 2204 is illuminated by the backlight may be reduced. By a double blocking of absorbing and reflecting the backlight, the influence of the backlight emitted by the backlight module 300 on the active layer 2204 may be effectively reduced, thereby reduce a possibility that the active layer 2204 generates photogenerated carriers, and a problem that a temperature of the active layer 2204 increases due to illumination may be reduced. In this way, a stability of the array substrate 2 is improved. In some embodiments, the light-blocking body 201 may also be formed by or made of the light-reflecting materials, and the light-absorbing materials may be dispersed in the light-blocking body 201 made of the light-reflecting materials.

Figure 4:
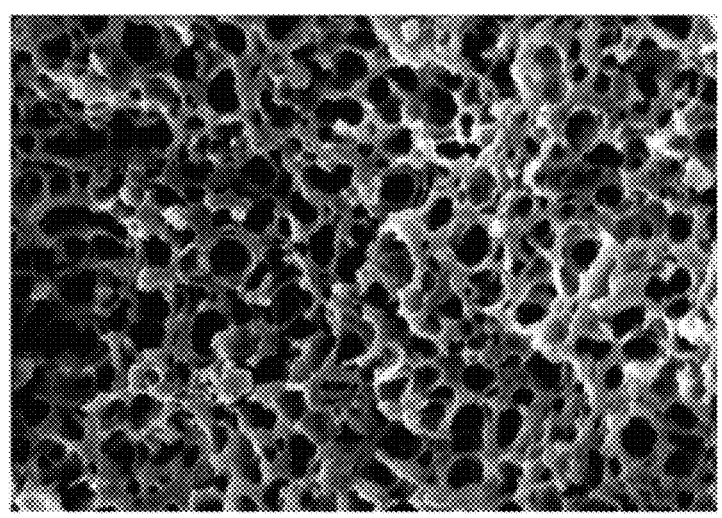
FIG. 4 is an electron microscope scanning diagram of a light-blocking body with a porous structure provided by some embodiments of the present disclosure.
Figure 5:
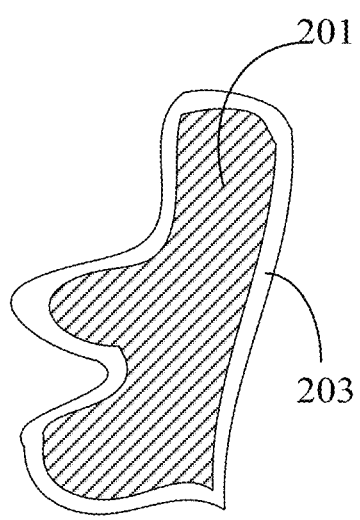
FIG. 5 is a partial schematic structural view of the light-blocking body with the porous structure provided by FIG. 4 according to some embodiments of the present disclosure.

As shown in FIGS. 4 and 5, FIG. 4 is an electron microscope scanning diagram of a light-blocking body with a porous structure provided by some embodiments of the present disclosure. FIG. 5 is a partial schematic structural view of the light-blocking body with the porous structure provided by FIG. 4 according to some embodiments of the present disclosure.

In some embodiments, in order to improve a heat-insulating performance of the light-blocking and heat-insulating layer 20, the light-blocking body 201 may be configured as a porous structure. It may also be understood as, the light-blocking body 201 has a plurality of micropores 2011. The heat-insulating performance of the light-blocking and heat-insulating layer 20 may be improved by using the plurality of microporous 2011 of the porous structure. Furthermore, in order to improve a light-blocking performance of the light-blocking and heat-insulating layer 20, an inner surface of each of the plurality of microporous 2011 of the porous structure is arranged with the light-reflecting materials to form a light-reflecting coating 203 by taking advantage of a large specific surface area of the porous structure. Since the light-reflecting coating 203 is arranged on the inner surface of each of the plurality of microporous 2011, the light-reflecting coating 203 has a large light-reflecting area. In some embodiments, the light-reflecting materials are arranged on both inner and outer surfaces of each of the plurality of microporous 2011 of the porous structure to form the light-reflecting coating 203, so as to improve light-blocking and heat-insulating performances of the light-blocking body 201. By arranging the light-reflecting coating 203 on a surface of the porous structure, a light-reflecting area may be increased, and a light-reflecting angle may also be expanded, so as to greatly improve a light-reflecting efficiency. The backlight not reflected by the light-reflecting coating 203 is absorbed by the light-blocking body 201 made of the light absorbing materials, thereby improving the light-blocking and heat-insulating performances of the light-blocking and heat-insulating layer 20. A thickness of the light-reflecting coating 203 is in a range from approximately 50 nm to approximately 500 nm. In some embodiments, the thickness of the light-reflecting coating 203 is in a range from 75 nm to approximately 200 nm.

Specifically, the light-blocking body 201 is a porous structure made of the light-absorbing materials. The light-blocking body 201 has a plurality of micropores 2011 in communication with each other. The light-reflecting materials may be deposited on inner and outer surfaces of the plurality of micropores 2011 by evaporation or magnetron sputtering to form the light-reflecting coating 203 on the inner and outer surfaces of the plurality of micropores 2011. In some embodiments, the light-reflecting materials may also be dispersed into a solution, and the light-blocking body 201 with the porous structure may be completely immersed in the solution with the light-reflecting materials dispersed therein, so that the light-reflecting materials may enter the plurality of microporous 2011 of the light-blocking body 201 and be adsorbed on the inner and outer surfaces of the plurality of microporous 2011. After being dried, the light-reflecting coating 203 may be formed on the inner and outer surfaces of the microporous 2011 by the light-reflecting materials may.

Figure 6:
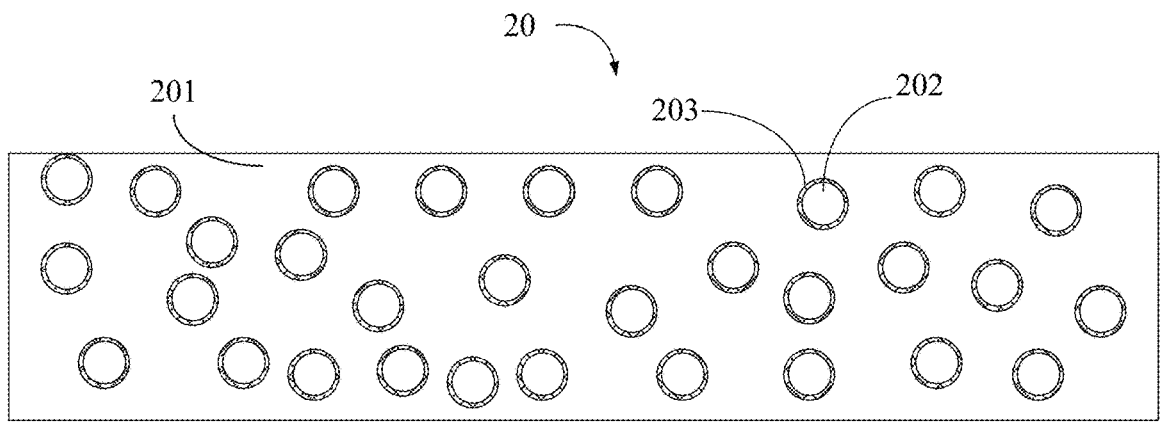
FIG. 6 is a schematic structural view of the light-blocking and heat-insulating layer provided by some embodiments of the present disclosure.
Figure 7:
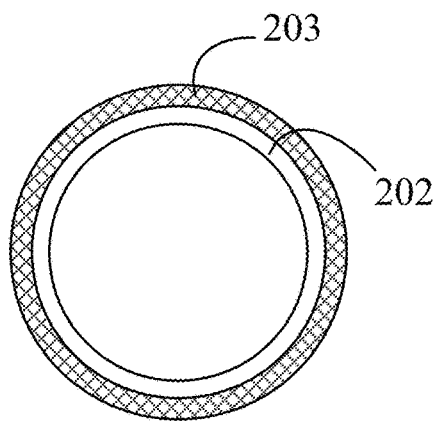
FIG. 7 is a schematic structural view of a microparticle provided by FIG. 6 according to some embodiments of the present disclosure.

As shown in FIGS. 6 and 7, FIG. 6 is a schematic structural view of the light-blocking and heat-insulating layer provided by some embodiments of the present disclosure. FIG. 7 is a schematic structural view of a microparticle provided by FIG. 6 according to some embodiments of the present disclosure.

In some embodiments, a plurality of microparticles 202 are arranged in the light-blocking body 201. In some embodiments, each of the plurality of microparticles 202 may be a microsphere. For example, a shape of each microparticle 202 may not be strictly spherical, and may also be ellipsoidal or other similar spherical shapes. A maximum radial size of each microparticle 202 is not limited, and the maximum radial size of each microparticle 202 may be in a range from approximately 200 nm to approximately 500 nm. Each microparticle 202 is made of the light-reflecting materials. Due to characteristic of a large surface area of the microparticles 202, light-reflecting areas of the microparticles 202 may be increased, and the light-reflecting angle may be expanded, thereby improving the light-reflecting efficiency. In some embodiments, each microparticle 202 may be a hollow structure, and the microparticle 202 with the hollow structure may improve the heat-insulating performance of the light-blocking and heat-insulating layer 20. Furthermore, in the light-blocking body 201 with the porous structure, since the plurality of micropores in the porous structure are a continuous phase, the plurality of micropores 2011 are filled with air. In addition, since the air may also conduct heat, in order to further improve the heat-insulating performance of the light-blocking and heat-insulating layer 20, an interior of the hollow structure of the microparticle 202 with the hollow structure is a vacuum environment. The heat-insulating performance of the light-blocking and heat-insulating layer 20 may be further improved by using the microparticle 202 with the hollow structure having the vacuum or the vacuum environment inside. In some embodiments, due to a relatively low heat-conducting property of inert gas, an interior of the hollow structure may also be filled with the inert gas to improve the heat-insulating performance of the light-blocking and heat-insulating layer 20.

As shown in FIG. 7, an outer surface of each microparticle 202 is arranged with a light-reflecting coating 203 made of the light-reflecting materials. Due to structural characteristic of a large outer surface area of the microparticle 202, a light-reflecting area may be increased and a light-reflecting angle may be expanded by arranging the light-reflecting coating 203 on a surface of each microparticle 202, thereby greatly improving the light-reflecting efficiency. Since the light-reflecting coating 203 is arranged on the outer surface of each microparticle 202, the light-reflecting coating 203 has a larger light-reflecting area. By arranging the light-reflecting coating 203 on the surface of the microparticle 202 with the hollow structure having the vacuum or the vacuum environment inside, not only a better light-reflecting effect may be achieved, but also a better heat-insulating effect may be achieved.

In some embodiments, the light-reflecting coating 203 is arranged on the surface of the microparticle 202 with a hollow structure having the vacuum or the vacuum environment inside. The plurality of microparticles 202 are dispersed in the light-blocking body 201 with a porous structure made of the light-absorbing materials. The light-reflecting materials are arranged on inner and outer surfaces of the porous structure to form the light-reflecting coating 203 on the surface of the porous structure. The heat-insulating performance of the light-blocking and heat-insulating layer 20 may be improved by using the porous structure and the microparticles 202 with hollow structures having the vacuum or the vacuum environment inside. The microparticles 202 made of the light-reflecting materials, the light-reflecting coating 203 formed on the surface of each of the microparticles 202, or the light-reflecting coating 203 in the porous structure may reflect the backlight emitted by the backlight module 300 to other areas in which the active layer 2204 is not arranged, so as to improve a light-blocking performance. Since the backlight emitted by the backlight module 300 is reflected to other areas in which the active layer 2204 is not arranged, the heat-insulating performance of the light-blocking and heat-insulating layer 20 may be further improved. The light-blocking body 201 made of the light absorbing materials may absorb the unreflected backlight, and further improve the light-blocking performance.

The light-reflecting materials may be metal materials, or black organic or inorganic materials. In case that the light-reflecting materials are black metal materials, an influence of illumination on the active layer 2204 may be reduced due to a good light-blocking property of the metal materials. In case that the light-reflecting materials are the black organic or inorganic materials, an influence of a coupling capacitance between the light-blocking and heat-insulating layer 20 and the active layer 2204 on the display panel 200 may be reduced due to a non-conductive property of the organic materials and inorganic materials.

In this embodiment, the light-reflecting materials include at least one of silver, copper, aluminum, iron, and titanium. The light-reflecting materials may also be other materials with light-reflecting properties. The light-absorbing materials include at least one of graphene, carbon nanotubes, carbon black, polyethylene terephthalate, polyurethane, polymethyl methacrylate, and polyester fiber. The light-absorbing materials may also be other materials with light-absorbing properties.

Figure 8:
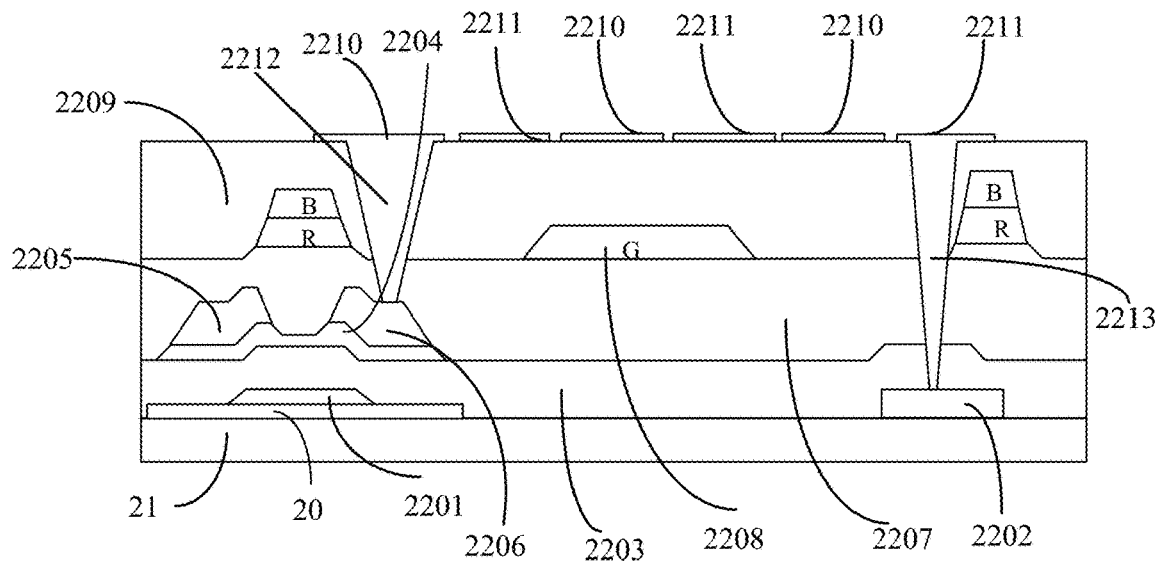
FIG. 8 is a schematic structural view of an array substrate provided by some embodiments of the present disclosure.

As shown in FIG. 8, FIG. 8 is a schematic structural view of an array substrate provided by some embodiments of the present disclosure.

In some embodiments, the array substrate 2 includes a substrate baseplate 21, one or more light-blocking and heat-insulating layers 20, and one or more thin film transistors 22. The one or more thin film transistors 22 are arranged on a surface of the substrate baseplate 21 on which the one or more light-blocking and heat-insulating layers 20 are arranged. Each of the one or more thin film transistors 22 includes a gate metal layer 2201, a gate insulating layer 2203, an active layer 2204, a source electrode 2205, a drain electrode 2206, a passivation layer 2207, a color-resisting layer 2208, a flattening layer 2209, an anode 2210, a cathode 2211, an anode connecting portion 2212, a cathode connecting portion 2213, and a common electrode line 2202. The one or more light-blocking and heat-insulating layers 20 correspond to the one or more thin film transistors 22 in one-to-one correspondence. Each of the one or more light-blocking and heat-insulating layers 20 corresponds to the active layer 2204 of a corresponding one of the one or more thin film transistors, to block light and insulate heat for the corresponding active layer 2204.

The gate metal layer 2201 and the common electrode line 2202 are arranged on a surface of the substrate baseplate 21 on which the one or more light-blocking and heat-insulating layer 20 are arranged. The gate metal layer 2201 is arranged on a side of each of the one or more light-blocking and heat-insulating layers 20 away from the substrate baseplate 21. The gate metal layer 2201 is spaced apart from the common electrode line 2202. A surface of a side of the substrate baseplate 21 arranged with the gate metal layer 2201 is arranged with the gate insulating layer 2203. The gate insulating layer 2203 covers the gate metal layer 2201, the light-blocking and heat-insulating layer 20, and the common electrode line 2202. A surface of the gate insulating layer 2203 away from the substrate baseplate 21 is arranged with the active layer 2204. The active layer 2204 is spaced apart from a corresponding one of the one or more light-blocking and heat-insulating layers 20. Specifically, a projection of the active layer 2204 projected on the substrate baseplate 21 is within a projection of the corresponding one of the one or more light-blocking and heat-insulating layers 20 projected on the substrate baseplate 21. The source electrode 2205 and the drain electrode 2206 are arranged on a surface of the active layer 2204, and the source electrode 2205 and drain electrode 2206 are spaced apart from each other. The passivation layer 2207 covers the source electrode 2205, the drain electrode 2206, and the active layer 2204. A side surface of the passivation layer 2207 away from the gate insulating layer 2203 is arranged with the color-resisting layer 2208. The color-resisting layer 2208 includes a red color resistor (R), a green color resistor (G), and a blue color resistor (B). The blue color resistor (B) and the red color resistor (R) are stacked on one another. The blue color resistor (B) is arranged on a side of the red color resistor (R) away from the passivation layer 2207. The red color resistor (R) and the green color resistor (G) are arranged on the passivation layer 2207, and the red color resistor (R) is spaced apart from the green color resistor (G). Thicknesses of the red color resistor (R), the green color resistor (G), and the blue color resistor (B) may be the same. A side of the passivation layer 2207 arranged with the color resistor layer 2208 is arranged with the flattening layer 2209. The flattening layer 2209 may cover the color resistor layer 2208. A surface of the flattening layer 2209 away from the passivation layer 2207 is arranged with the anode 2210 and the cathode 2211. The anode 2210 is connected with the drain electrode 2206 through the anode connecting portion 2212. The cathode 2211 is connected with the common electrode line 2202 through the cathode connecting portion 2213.

In the display device provided by some embodiments, the array substrate includes an active layer and a light-blocking and heat-insulating layer. The light-blocking and heat-insulating layer is arranged on a side of the active layer and configured to block light and insulate heat for the active layer. The light-blocking and heat-insulating layer includes light-absorbing materials and light-reflecting materials. The light-blocking and heat-insulating layer includes a light-blocking body made of the light absorbing materials. The light-reflecting materials are dispersed in the light-blocking body. In some embodiments of the present disclosure, backlight emitted by the backlight module may be absorbed through the light-blocking body made of the light absorbing materials, and the backlight emitted by the backlight module may be reflected through the light-reflecting materials dispersed in the light-blocking body, so that the light-blocking and heat-insulating layer blocks the backlight emitted by the backlight module. The backlight may be blocked by the light-blocking and heat-insulating layer, so as to reduce a possibility that the active layer generates photogenerated carriers, and solve a problem that a temperature of the array substrate increases due to the illumination. In this way, a product quality of the display panel with the light-blocking and heat-insulating layer is improved, and problems of crosstalk and residual image of the display panel are reduced.

The above description are only embodiments of the present disclosure, and do not limit the scope of the present disclosure. Any equivalent structure or equivalent process transformation made by using the contents of the description and drawings of the present disclosure, or directly or indirectly used in other related technical fields, are similarly included in the scope of patent protection of the present disclosure.

What is claimed is:

1. An array substrate, comprising:
   an active layer; and
   a light-blocking and heat-insulating layer, arranged on a side of the active layer and configured to block light and insulate heat for the active layer;
   wherein the light-blocking and heat-insulating layer comprises light-absorbing materials and light-reflecting materials, one of the light-absorbing materials and the light-reflecting materials form a light-blocking body, and the other one of the light-absorbing materials and the light-reflecting materials are dispersed in the light-blocking body; and
   wherein the light-absorbing materials form the light-blocking body, the light-blocking body is a porous structure, and a light-reflecting coating is arranged on at least one of an inner surface and an outer surface of each of micropores of the porous structure by using the light-reflecting materials; or the light-absorbing materials form the light-blocking body, a plurality of microparticles are dispersed in the light-blocking body, a light-reflecting coating is arranged on an outer surface of each of the plurality of microparticles by using the light-reflecting materials, or materials of the plurality of microparticles are the light-reflecting materials.

2. The array substrate according to claim 1, wherein a thickness of the light-reflecting coating is in a range from approximately 50 nm to approximately 500 nm.

3. The array substrate according to claim 1, wherein each of the plurality of microparticles is a hollow structure.

4. The array substrate according to claim 3, wherein an interior of the hollow structure is a vacuum environment, or filled with inert gas.

5. The array substrate according to claim 1, wherein a maximum radial size of each of the plurality of microparticles is in a range from approximately 200 nm to approximately 500 nm.

6. The array substrate according to claim 1, wherein the light-reflecting materials comprise at least one of silver, copper, aluminum, iron, and titanium.

7. The array substrate according to claim 1, wherein the light-absorbing materials comprise at least one of graphene, carbon nanotubes, carbon black, polyethylene terephthalate, polyurethane, polymethyl methacrylate, and polyester fiber.

8. The array substrate according to claim 1, wherein a thickness of the light-blocking and heat-insulating layer is in a range from approximately 0.5 μm to approximately 3 μm.

9. The array substrate according to claim 1, further comprising:
   a substrate baseplate; and
   a plurality of thin film transistors, arranged in an array on a side of the substrate baseplate, each of the plurality of thin film transistors comprising the active layer, and the active layer being an amorphous silicon semiconductor layer;
   wherein the light-blocking and heat-insulating layer is arranged between the substrate baseplate and the active layer, and a projection of the active layer projected on the substrate baseplate is within a projection of the light-blocking and heat-insulating layer projected on the substrate baseplate.

10. A display panel comprising:
    a first substrate;
    a second substrate, arranged opposite to the first substrate; and
    a display medium, located between the first substrate and the second substrate;
    wherein the second substrate comprises:
        a substrate baseplate;
        a plurality of thin film transistors, arranged in an array on a side of the substrate baseplate, each of the plurality of thin film transistors comprising an active layer; and
        a plurality of light-blocking and heat-insulating layers, corresponding to the plurality of thin film transistors in one-to-one correspondence, each of the plurality of light-blocking and heat-insulating layers being arranged between the active layer of a corresponding one of the plurality of thin film transistors and the substrate baseplate, or arranged on a side of the substrate baseplate away from the active layer of the corresponding one of the plurality of thin film transistors;
        wherein the light-blocking and heat-insulating layer comprises light-absorbing materials and light-reflecting materials, one of the light-absorbing materials and the light-reflecting materials form a light-blocking body, and the other one of the light-absorbing materials and the light-reflecting materials are dispersed in the light-blocking body; and wherein the light-absorbing materials form the light-blocking body, the light-blocking body is a porous structure, and a light-reflecting coating is arranged on at least one of an inner surface and an outer surface of each of micropores of the porous structure by using the light-reflecting materials; or the light-absorbing materials form the light-blocking body, a plurality of microparticles are dispersed in the light-blocking body, a light-reflecting coating is arranged on an outer surface of each of the plurality of microparticles by using the light-reflecting materials, or materials of the plurality of microparticles are the light-reflecting materials.

11. The display panel according to claim 10, wherein each of the plurality of microparticles is a hollow structure.

12. A display device, comprising:
a backlight module; and
a display panel comprising:
 a first substrate;
 a second substrate, arranged opposite to the first substrate; and
 a display medium, located between the first substrate and the second substrate;
 wherein the second substrate comprises:
  a substrate baseplate;
  a plurality of thin film transistors, arranged in an array on a side of the substrate baseplate, each of the plurality of thin film transistors comprising an active layer; and
  a plurality of light-blocking and heat-insulating layers, corresponding to the plurality of thin film transistors in one-to-one correspondence, each of the plurality of light-blocking and heat-insulating layers being arranged between the active layer of a corresponding one of the plurality of thin film transistors and the substrate baseplate, or arranged on a side of the substrate baseplate away from the active layer of the corresponding one of the plurality of thin film transistors;

wherein the light-blocking and heat-insulating layer comprises light-absorbing materials and light-reflecting materials, one of the light-absorbing materials and the light-reflecting materials form a light-blocking body, and the other one of the light-absorbing materials and the light-reflecting materials are dispersed in the light-blocking body; and wherein the light-absorbing materials form the light-blocking body, the light-blocking body is a porous structure, and a light-reflecting coating is arranged on at least one of an inner surface and an outer surface of each of micropores of the porous structure by using the light-reflecting materials; or the light-absorbing materials form the light-blocking body, a plurality of microparticles are dispersed in the light-blocking body, a light-reflecting coating is arranged on an outer surface of each of the plurality of microparticles by using the light-reflecting materials, or materials of the plurality of microparticles are the light-reflecting materials.

13. The display device according to claim 12, wherein each of the plurality of microparticles is a hollow structure.

* * * * *